(12) United States Patent
Manassen et al.

(10) Patent No.: US 9,429,856 B1
(45) Date of Patent: Aug. 30, 2016

(54) DETECTABLE OVERLAY TARGETS WITH STRONG DEFINITION OF CENTER LOCATIONS

(71) Applicant: KLA-Tencor Corporation, Milpitas, CA (US)

(72) Inventors: Amnon Manassen, Haifa (IL); Barry Loevsky, Yokneam Illit (IL)

(73) Assignee: KLA-Tencor Corporation, Milpitas, CA (US)

( * ) Notice: Subject to any disclaimer, the term of this patent is extended or adjusted under 35 U.S.C. 154(b) by 0 days.

(21) Appl. No.: 14/160,249

(22) Filed: Jan. 21, 2014

Related U.S. Application Data

(60) Provisional application No. 61/754,755, filed on Jan. 21, 2013.

(51) Int. Cl.
*G03F 7/20* (2006.01)
*H01L 23/544* (2006.01)
*G01B 11/14* (2006.01)

(52) U.S. Cl.
CPC .......... *G03F 7/70633* (2013.01); *G01B 11/14* (2013.01); *H01L 23/544* (2013.01)

(58) Field of Classification Search
None
See application file for complete search history.

(56) References Cited

U.S. PATENT DOCUMENTS

| | | | |
|---|---|---|---|
| 4,643,579 A * | 2/1987 | Toriumi et al. | 356/401 |
| 4,929,083 A | 5/1990 | Brunner | |
| 4,973,136 A | 11/1990 | Braatz | |
| 5,086,477 A | 2/1992 | Yu et al. | |
| 5,151,750 A | 9/1992 | Magome et al. | |
| 5,216,257 A | 6/1993 | Brueck et al. | |
| 5,583,609 A | 12/1996 | Mizutani et al. | |
| 5,602,492 A | 2/1997 | Cresswell et al. | |
| 5,712,707 A | 1/1998 | Ausschnitt et al. | |
| 5,723,236 A | 3/1998 | Inoue et al. | |
| 5,731,877 A | 3/1998 | Ausschnitt | |
| 5,753,416 A | 5/1998 | Okamoto et al. | |
| 5,965,307 A | 10/1999 | Miyatake | |
| 6,150,231 A | 11/2000 | Muller et al. | |
| 6,301,798 B1 * | 10/2001 | Liu et al. | 33/645 |
| 6,538,740 B1 | 3/2003 | Shiraishi et al. | |
| 6,660,462 B1 | 12/2003 | Fukuda | |
| 6,730,444 B2 | 5/2004 | Bowes | |
| 6,742,168 B1 | 5/2004 | Nariman | |
| 6,788,393 B2 | 9/2004 | Inoue | |
| 6,812,045 B1 | 11/2004 | Nikoonahad et al. | |

(Continued)

FOREIGN PATENT DOCUMENTS

| | | | |
|---|---|---|---|
| KR | 2003053224 A | * | 6/2003 |
| KR | 2006019761 A | * | 3/2006 |
| WO | 2013132064 A2 | | 9/2013 |

*Primary Examiner* — Gordon J Stock, Jr.
(74) *Attorney, Agent, or Firm* — Suiter Swantz pc llo (57) ABSTRACT

An overlay target for a semiconductor device is disclosed. The overlay measurement target includes a first ring target located on a first measured layer of the semiconductor device. The first ring target includes a plurality of detectable features arranged in a circular manner having a first circumference. The overlay measurement target also includes a second ring target located on a second measured layer of the semiconductor device. The second ring target includes a plurality of detectable features arranged in a circular manner having a second circumference different from the first circumference. The displacement between a detected center of the first ring target and a detected center of the second ring target indicates an overlay error between the first measured layer and the second measured layer.

26 Claims, 7 Drawing Sheets

(56) References Cited

U.S. PATENT DOCUMENTS

| | | | |
|---|---|---|---|
| 6,836,560 B2 | 12/2004 | Emery | |
| 6,887,625 B2 | 5/2005 | Baselmans et al. | |
| 6,898,306 B1* | 5/2005 | Lu | G06T 7/0024 382/151 |
| 7,058,221 B1* | 6/2006 | Shikata | G06K 9/6203 382/169 |
| 7,180,593 B2* | 2/2007 | Lin | 356/401 |
| 7,288,344 B2 | 10/2007 | Frost et al. | |
| 7,440,105 B2 | 10/2008 | Adel et al. | |
| 7,465,591 B2 | 12/2008 | Borden et al. | |
| 7,528,941 B2 | 5/2009 | Kandel et al. | |
| 7,626,702 B2 | 12/2009 | Ausschnitt et al. | |
| 7,629,697 B2 | 12/2009 | Van Haren et al. | |
| 7,751,046 B2 | 7/2010 | Levy et al. | |
| 7,847,939 B2 | 12/2010 | Smith et al. | |
| 7,873,504 B1 | 1/2011 | Bevis | |
| 7,879,627 B2 | 2/2011 | Ghinovker et al. | |
| 8,441,639 B2 | 5/2013 | Kandel et al. | |
| 8,681,413 B2 | 3/2014 | Manassen et al. | |
| 2001/0007498 A1* | 7/2001 | Arai et al. | 356/401 |
| 2002/0041377 A1 | 4/2002 | Hagiwara et al. | |
| 2002/0158193 A1 | 10/2002 | Sezginer et al. | |
| 2003/0021465 A1 | 1/2003 | Adel et al. | |
| 2003/0223630 A1 | 12/2003 | Adel et al. | |
| 2003/0224261 A1 | 12/2003 | Schulz | |
| 2004/0004726 A1 | 1/2004 | Sezginer et al. | |
| 2004/0040003 A1* | 2/2004 | Seligson et al. | 716/4 |
| 2004/0184652 A1 | 9/2004 | Tsuchiya et al. | |
| 2004/0233439 A1 | 11/2004 | Mieher et al. | |
| 2005/0105092 A1 | 5/2005 | Ausschnitt et al. | |
| 2005/0140986 A1 | 6/2005 | Butler | |
| 2005/0173634 A1 | 8/2005 | Wong et al. | |
| 2005/0195398 A1 | 9/2005 | Adel et al. | |
| 2005/0272221 A1* | 12/2005 | Yen et al. | 438/401 |
| 2006/0051682 A1 | 3/2006 | Hess et al. | |
| 2006/0202360 A1* | 9/2006 | Saito | 257/797 |
| 2006/0210893 A1 | 9/2006 | Van Bilsen | |
| 2006/0269848 A1 | 11/2006 | Setta | |
| 2007/0058169 A1* | 3/2007 | Ausschnitt et al. | 356/401 |
| 2007/0069398 A1 | 3/2007 | Smith et al. | |
| 2007/0096094 A1 | 5/2007 | Levinski et al. | |
| 2007/0158580 A1 | 7/2007 | Ward et al. | |
| 2007/0158581 A1 | 7/2007 | Ward et al. | |
| 2007/0158582 A1 | 7/2007 | Ward et al. | |
| 2007/0230770 A1 | 10/2007 | Kulkarni et al. | |
| 2007/0279630 A1 | 12/2007 | Kandel et al. | |
| 2008/0094639 A1 | 4/2008 | Widmann et al. | |
| 2008/0112609 A1 | 5/2008 | Inoue | |
| 2008/0279442 A1 | 11/2008 | Den Boef et al. | |
| 2008/0279444 A1 | 11/2008 | Fischer et al. | |
| 2009/0001615 A1* | 1/2009 | Li et al. | 257/797 |
| 2009/0136117 A1 | 5/2009 | Barkol et al. | |
| 2009/0187383 A1 | 7/2009 | Li et al. | |
| 2009/0195768 A1 | 8/2009 | Bijnen et al. | |
| 2009/0220872 A1 | 9/2009 | Oishi | |
| 2009/0243095 A1 | 10/2009 | Fujita et al. | |
| 2010/0052191 A1 | 3/2010 | Trogisch et al. | |
| 2011/0069314 A1 | 3/2011 | Ausschnitt et al. | |
| 2011/0076789 A1 | 3/2011 | Kuroda | |
| 2011/0155904 A1 | 6/2011 | Hotta et al. | |
| 2011/0249247 A1 | 10/2011 | Cramer et al. | |
| 2012/0146159 A1 | 6/2012 | Wang et al. | |
| 2012/0206729 A1 | 8/2012 | Seligson et al. | |
| 2012/0243004 A1 | 9/2012 | El Gawhary et al. | |
| 2013/0083306 A1 | 4/2013 | Smirnov et al. | |
| 2013/0163852 A1* | 6/2013 | Ghinovker | 382/149 |
| 2013/0271740 A1 | 10/2013 | Quintanilha | |
| 2013/0304424 A1 | 11/2013 | Bakeman et al. | |
| 2014/0065832 A1 | 3/2014 | Hsieh et al. | |

* cited by examiner

DETECTABLE OVERLAY TARGETS WITH STRONG DEFINITION OF CENTER LOCATIONS

CROSS-REFERENCE TO RELATED APPLICATIONS

The present application claims the benefit under 35 U.S.C. §119(e) of U.S. Provisional Application Ser. No. 61/754,755, filed Jan. 21, 2013. Said U.S. Provisional Application Ser. No. 61/754,755 is hereby incorporated by reference in its entirety.

TECHNICAL FIELD

The disclosure generally relates to the field of semiconductor fabrication, particularly to configurations of metrology targets used for semiconductor device fabrication.

BACKGROUND

Thin polished plates such as silicon wafers and the like are a very important part of modern technology. A wafer, for instance, refers to a thin slice of semiconductor material used in the fabrication of integrated circuits and other devices. Other examples of thin polished plates may include magnetic disc substrates, gauge blocks and the like. Modern semiconductor devices are typically fabricated from layers of wafers. Precise positioning and alignment during semiconductor fabrication is of critical importance.

SUMMARY

The present disclosure is directed to a semiconductor device. The semiconductor device utilizes an overlay measurement target that includes a first ring target located on a first measured layer of the semiconductor device. The first ring target includes a plurality of detectable features arranged in a circular manner having a first circumference. The overlay measurement target also includes a second ring target located on a second measured layer of the semiconductor device. The second ring target includes a plurality of detectable features arranged in a circular manner having a second circumference different from the first circumference. The displacement between a detected center of the first ring target and a detected center of the second ring target indicates an overlay error between the first measured layer and the second measured layer.

The present disclosure is also directed to a metrology system. The metrology system includes an imaging device and a processor. The imaging device is configured for obtaining an image of a semiconductor device. The processor is configured for: identifying a first ring target from the image of the semiconductor device, the first ring target including a plurality of detectable features arranged in a circular manner having a first circumference; detecting a center of the first ring target; and utilizing the detected center of the first ring target for overlay measurement.

The present disclosure is further directed to an overlay target for a processing layer of a semiconductor device. The overlay target includes a plurality of detectable features spaced equally apart from each other and arranged in a circular manner having a predetermined diameter.

It is to be understood that both the foregoing general description and the following detailed description are exemplary and explanatory only and are not necessarily restrictive of the present disclosure. The accompanying drawings, which are incorporated in and constitute a part of the specification, illustrate subject matter of the disclosure. Together, the descriptions and the drawings serve to explain the principles of the disclosure.

BRIEF DESCRIPTION OF THE DRAWINGS

The numerous advantages of the disclosure may be better understood by those skilled in the art by reference to the accompanying figures in which.

DETAILED DESCRIPTION

Reference will now be made in detail to the subject matter disclosed, which is illustrated in the accompanying drawings.

Lithographic metrology and in particular, overlay measurements, employ overlay measurement targets to facilitate precise positioning and alignment of various layers during semiconductor fabrication processes. Overlay target marks or patterns are typically printed on the different layers and are resolved in microscopes using visible light. Misalignment between such marks or patterns may be detected and measured.

It is noted that since overlay targets consume real estate available on each layer, it is therefore desirable to reduce the size of such targets. More specifically, small targets that are less than 11 micrometers, or even less than 5 micrometers may be desirable. However, reduced target size may also result in reduced measurement accuracy. Therein lies a need for small overlay targets with strong definition of center locations for accurate measurement results.

Figure 1:
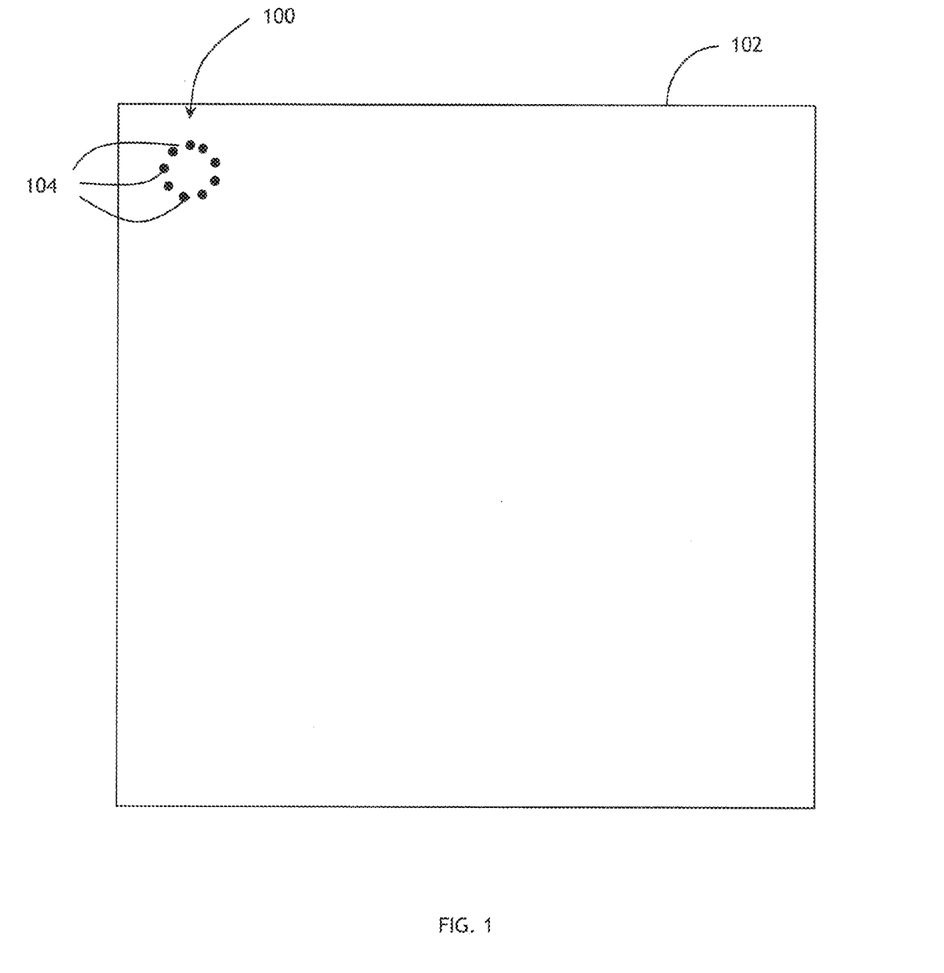
FIG. 1 is an illustration depicting an overlay target printed on a processing layer.
Figure 2:
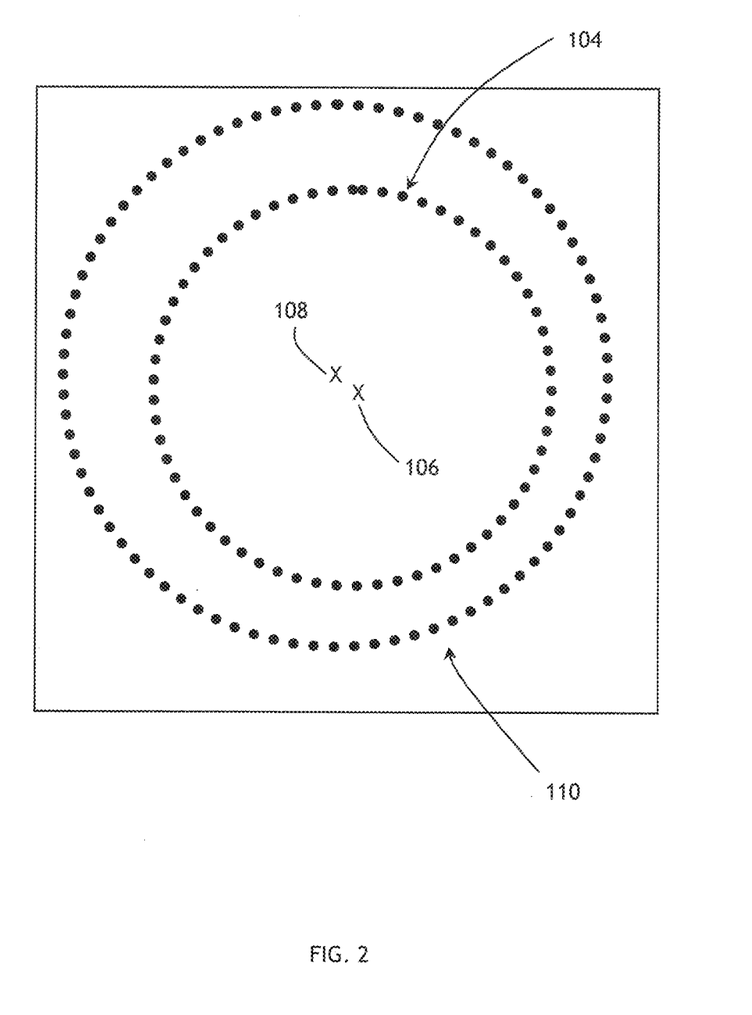
FIG. 2 is an illustration depicting the overlay target in accordance with certain embodiments of the present disclosure.

Referring generally to FIGS. 1 and 2, illustrations depicting a measurement target 100 for a process layer 102 of a semiconductor device is shown. The target 100 includes multiple detectable features 104 spaced equally apart from each other and forming a circumference of a circle. The center 106 of the circle defined by the detectable features 104 located on one particular process layer may be detected and compared against the center 108 of the circle defined by the detectable features 110 located on another process layer when the two process layers are overlaid.

As shown in FIG. 2, the displacement of the centers between two circles belonging to two different process layers indicates the overlay error. If the two circles are concentric, on the other hand, precise positioning and alignment for these two layers may be indicated. It is contemplated that larger circles may be used on layers that are harder to optically detect as larger circles generally contains more information, allowing the center locations to be determined more accurately. It is also contemplated that the number of process layers utilizing such features for overlay is not limited to two. That is, circles belonging to more than two different process layers can be utilized in the same manner without departing from the spirit and scope of the present disclosure.

A target having detectable features arranged in a circular manner in accordance with the present disclosure may be referred to as a ring target. It has been observed that arranging the detectable features of a ring target in such a manner makes the target very sensitive to its center location. In addition, the highly symmetric nature of such a target allows its center to be detected very accurately. And as described above, since the overlay is measured based on the detected center locations rather than the individual positions of the resolved features themselves, the detectable features of a ring target do not need to be individually resolved optically by imaging tools (e.g., microscopes) of a metrology system. This requirement for detectability (of the center location of the ring) rather than resolution (of each individual feature) allows the target size to be reduced to below 11 or even 5 micrometers.

It is contemplated that the detectable features of the same ring target may be configured to be substantially identical with respect to each other. However, different ring targets may be formed utilizing different detectable features. For instance, a detectable feature may be configured as a small dot feature, square feature, circular feature, line feature or the like without departing from the spirit and scope of the present disclosure.

It is also contemplated that various techniques may be utilized to find center locations of given ring targets. In one embodiment, the center of each ring target is found by shifting/sliding a mathematically constructed circle over the image of the ring target (e.g., image obtained by the metrology system) and looking for maximal overlap, expressed by a pure periodical signal. This center finding technique is demonstrated in a series of time-based illustrations shown in FIGS. 3 through 5.

More specifically, a mathematically constructed circle 302 is constructed for a ring target 300. The mathematically constructed circle 302 may then be positioned in proximity to the image of the ring target 300 and the signal overlap between the mathematically constructed circle 302 and target features 300 may be measured. Subsequently, the mathematically constructed circle 302 may be shifted (in a downward direction in the examples shown in FIGS. 3 through 5) slightly and the signal overlap between the mathematically constructed circle 302 and target features 300 may be measured again. This process may be repeated a number of times as the mathematically constructed circle 302 is being shifted, and the maximal overlap between the mathematically constructed circle 302 and target features 300 may be identified as the result.

Figure 3:
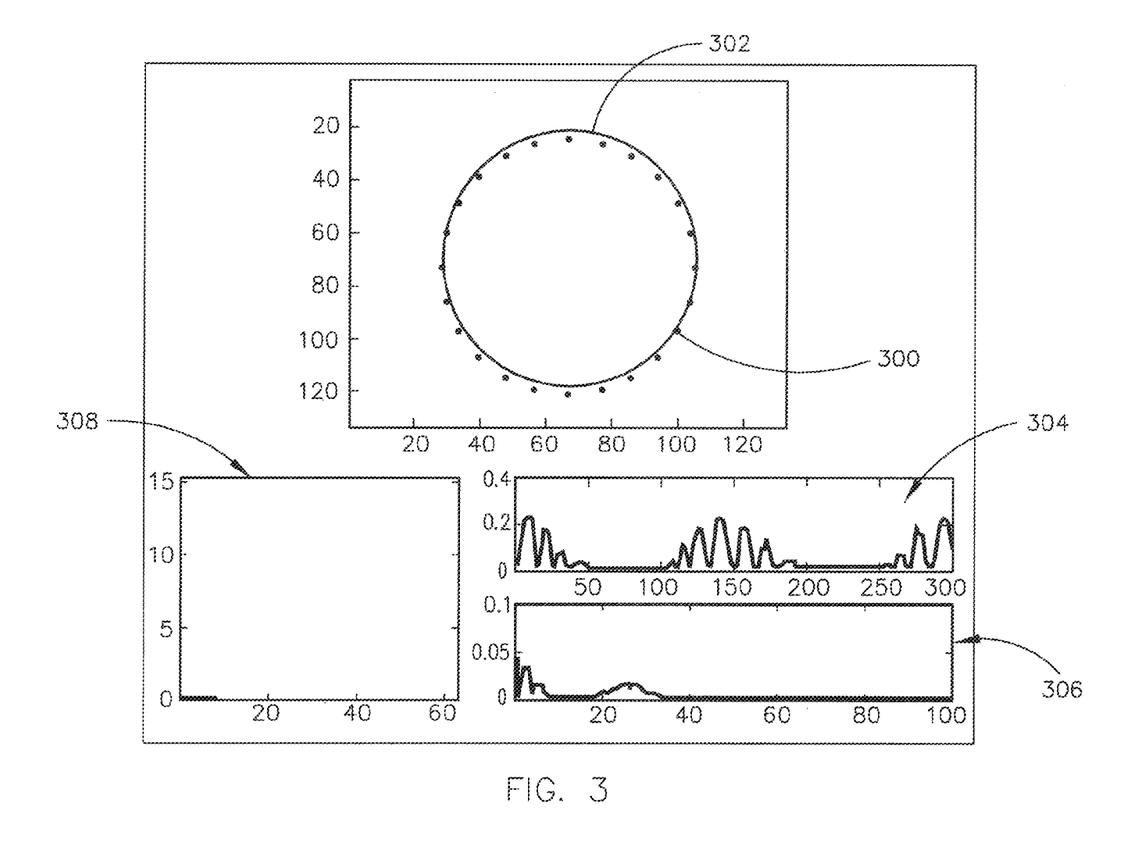
FIG. 3 is an illustration depicting a mathematically constructed circle utilized for detecting a center of a ring target.
Figure 4:
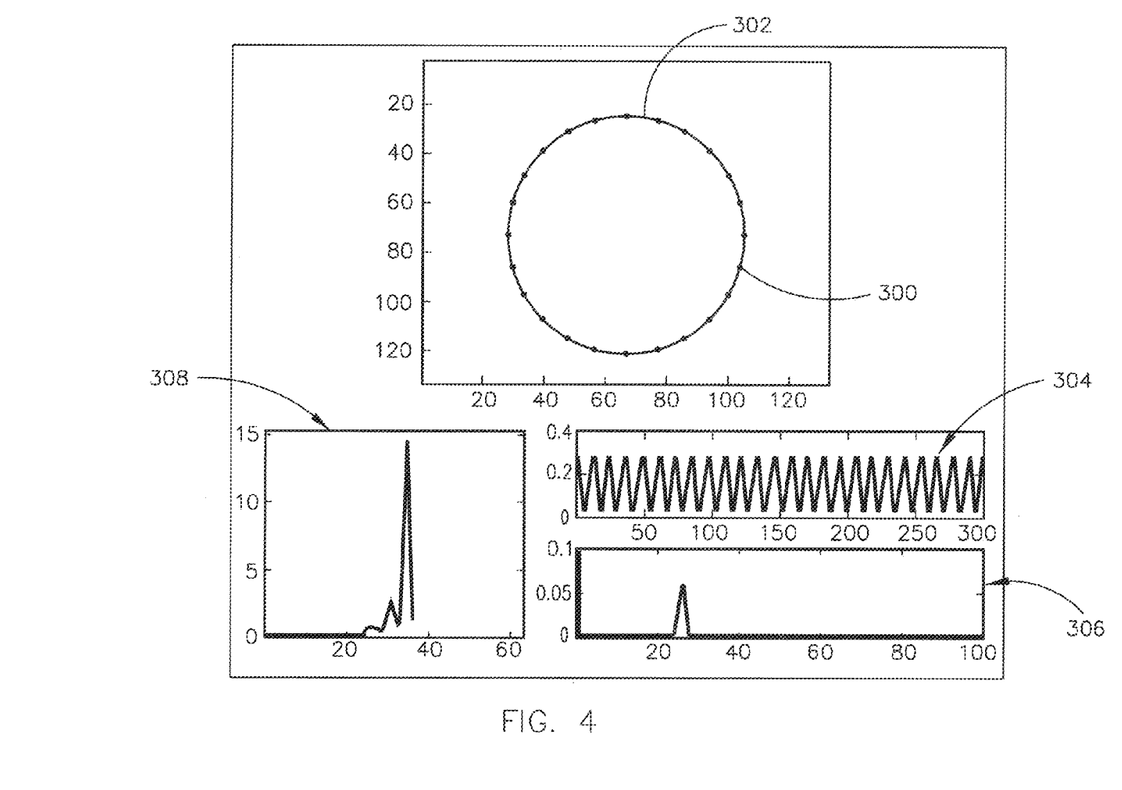
FIG. 4 is an illustration depicting the mathematically constructed circle utilized for detecting the center of the ring target of FIG. 3, wherein the mathematically constructed circle is shifted downwardly with respect to FIG. 3.
Figure 5:
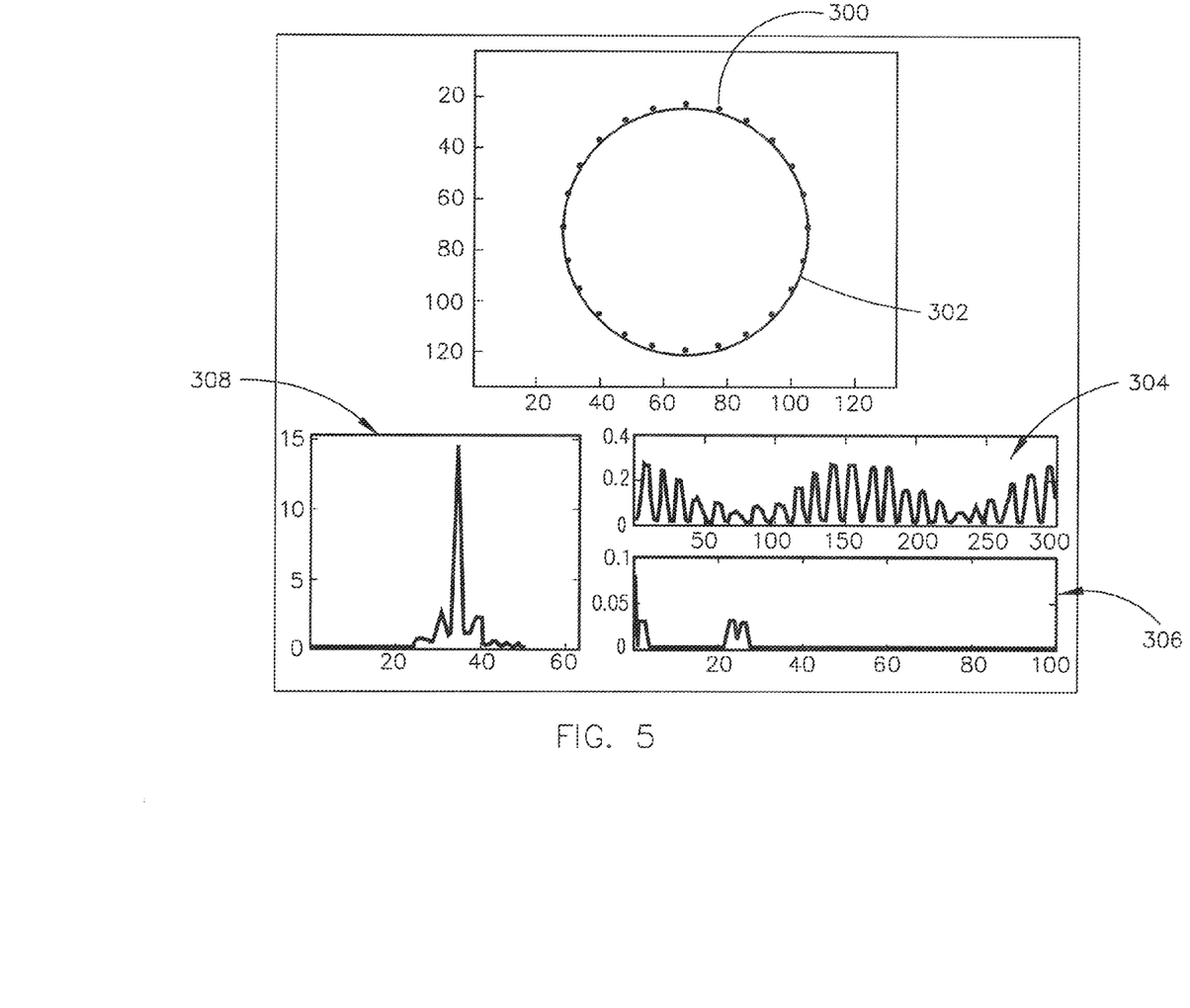
FIG. 5 is an illustration depicting the mathematically constructed circle utilized for detecting the center of the ring target of FIGS. 3 and 4, wherein the mathematically constructed circle is shifted further downwardly with respect to FIG. 4.

This is further illustrated using the angular intensity signal Fourier transform of the overlap signals depicted in FIGS. 3 through 5. In this example, signal 304 represents the measured angular intensity and signal 306 represents the Fourier transform of the angular intensity. It is noted that the tangential sampling of the target will provide two spatial frequencies (in tangential direction), $F_N$ and $F_2$, where N is the number of detectable features (dots) in the ring, and $F_2$ is the overlap frequency. The ratio $F_N/F_2$ can be utilized to determine when the overlap is maximized. More specifically, when the overlap of the ring is not perfect, the amplitude of $F_2$ is high and the ratio $F_N/F_2$ (signal 308) is low as shown in FIG. 3. As the mathematically constructed circle 302 moves downward, and when the overlap of the ring is perfect, amplitude of $F_2$ is ~0 and the ratio $F_N/F_2$ is maximized as shown in FIG. 4. Furthermore, as the mathematically constructed circle 302 continues to move downward, the amplitude of $F_2$ increases again and the ratio $F_N/F_2$ decreases again as shown in FIG. 5. In the example described above, the position of the mathematically constructed circle 302 as shown in FIG. 4 provides the maximal overlap with the target features 300. Therefore, the center location of this mathematically constructed circle 302 can be utilized as the detected center location of the target features 300.

It is contemplated that while the mathematically constructed circle 302 is shifted in a downward direction in the examples above, such a direction is merely exemplary, and the mathematically constructed circle 302 may be shifted in other directions as needed without departing from the spirit and scope of the present disclosure.

Figure 6:
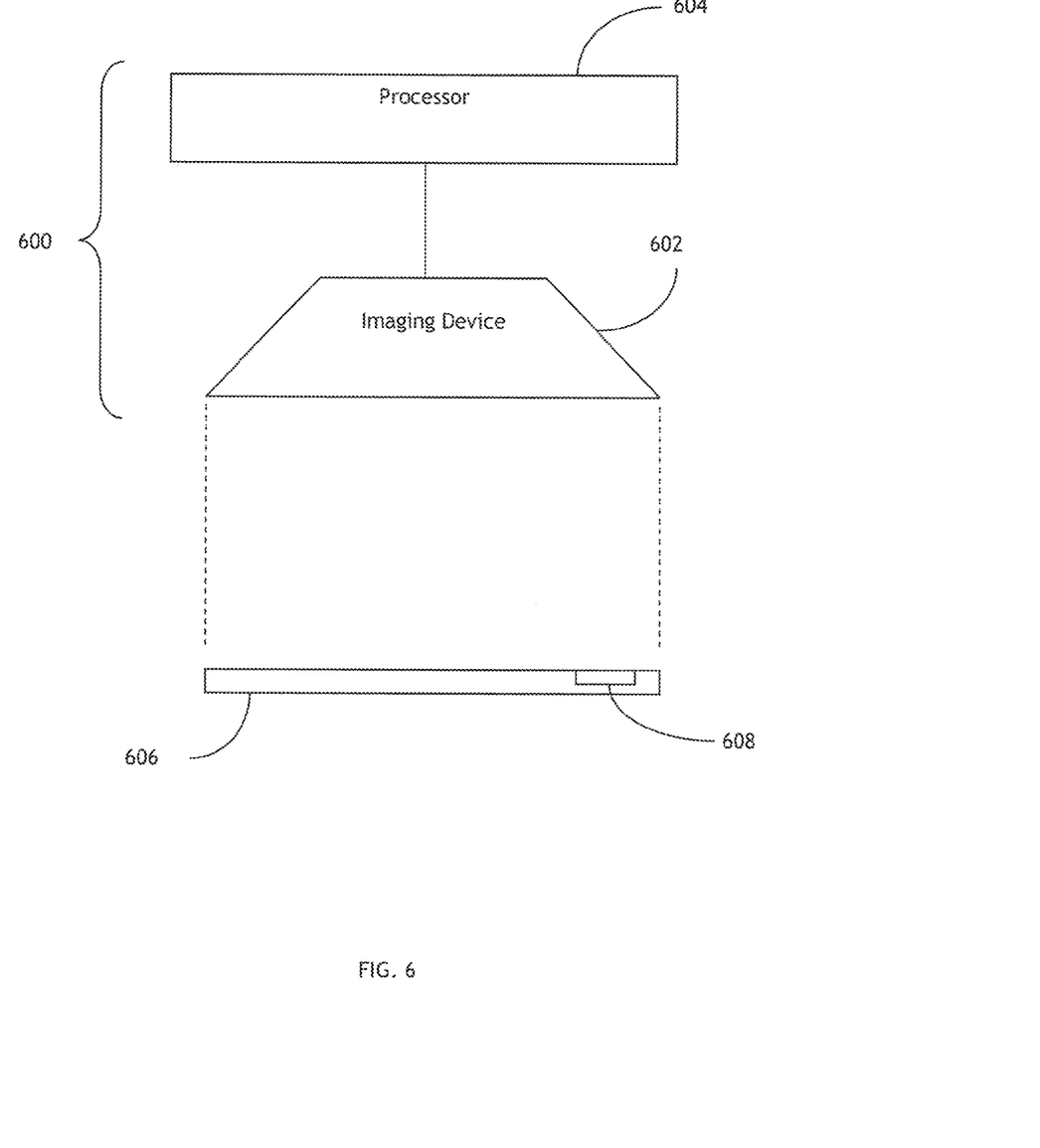
FIG. 6 is a block diagram depicting a metrology system.

Referring now to FIG. 6, a block diagram depicting a metrology system 600 capable of performing the various measurement processes described above is shown. The metrology system 600 may include an imaging devices (e.g., a scanner, a microscope or the like) 602 configured for obtaining images of a semiconductor device 606 (e.g., a wafer). For instance, the imaging device 602 may capture an aerial image (e.g., top views) of the semiconductor device 606 and provide the image to a processor 604 configured for processing the obtained image. It is contemplated that the metrology system 600 may include more than one imaging device without departing from the spirit and scope of the present disclosure. Certain metrology systems may provide the abilities to capture both sides of the semiconductor device simultaneously.

The processor 604 may be implemented utilizing any standalone or embedded computing device (e.g., a computer, a processing unit/circuitry or the like). Upon receiving the image from the imaging device 602, the processor 604 may identify one or more targets 608 present on the wafer 606 and carry out the various measurement processes described above.

Figure 7:
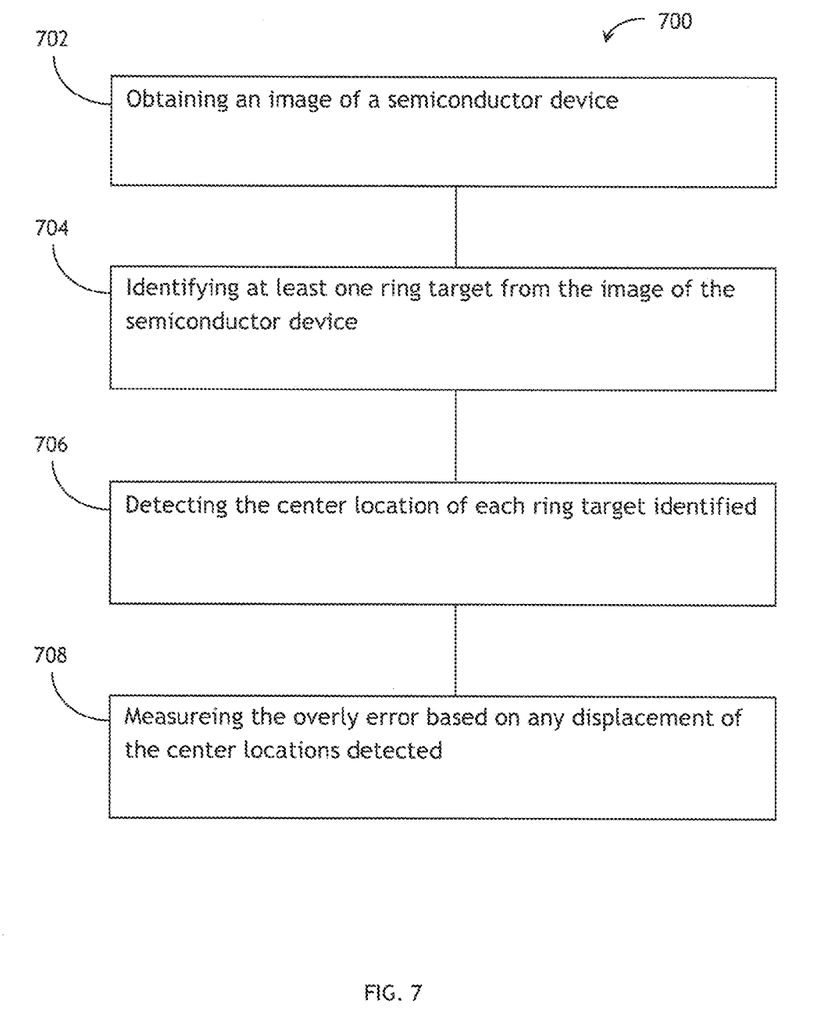
FIG. 7 is a flow diagram illustrating a method for measuring overlay utilizing metrology targets obtained by the metrology system.

For instance, FIG. 7 illustrates a method 700 for measuring overlay utilizing metrology targets 608 obtained by the metrology system 600. Once the image of the semiconductor wafer is obtained in step 702, step 704 may then identify a plurality of metrology targets from the image of the semiconductor wafer. Each of the plurality of metrology targets may include a ring target as described above, and step 706 may detect the center location of each ring target accordingly. Step 708 may measure the overly error based on any displacement of the center locations detected.

The methods disclosed may be implemented as sets of instructions, through a single production device, and/or through multiple production devices. Further, it is understood that the specific order or hierarchy of steps in the methods disclosed are examples of exemplary approaches. Based upon design preferences, it is understood that the specific order or hierarchy of steps in the method can be rearranged while remaining within the scope and spirit of the disclosure. The accompanying method claims present elements of the various steps in a sample order, and are not necessarily meant to be limited to the specific order or hierarchy presented.

It is believed that the system and method of the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory.

What is claimed is:

1. A semiconductor device, the semiconductor device including an overlay measurement target, the overlay measurement target comprising:
   a first ring target located on a first measured layer of the semiconductor device, the first ring target including a plurality of detectable features arranged in a circular manner having a first circumference; and
   a second ring target located on a second measured layer of the semiconductor device, the second ring target including a plurality of detectable features arranged in a circular manner having a second circumference different from the first circumference,
   wherein a center of the first ring target is detectable by:
      constructing a first mathematically constructed circle overlaid on a portion of an image of the semiconductor device including the first ring target, wherein a circumference of the first mathematically constructed circle is aligned along the plurality of detectable features associated with the first ring target, and
      determining the center of the first ring target as a center of the first mathematically constructed circle,
   wherein a center of the second ring target is detectable by:
      constructing a second mathematically constructed circle overlaid on a portion of an image of the semiconductor device including the second ring target, wherein a circumference of the second mathematically constructed circle is aligned along the plurality of detectable features associated with the second ring target, and
      determining the center of the second ring target as a center of the second mathematically constructed circle, and
   wherein a displacement between the center of the first ring target and the center of the second ring target indicates an overlay error between the first measured layer and the second measured layer.

2. The semiconductor device of claim 1, wherein two or more detectable features of the plurality of detectable features in the first ring target are spaced equally along the first circumference, and two or more detectable features of the plurality of detectable features in the second ring target are spaced equally along the second circumference.

3. The semiconductor device of claim 1, wherein two or more detectable features of the plurality of detectable features in the first ring target are identical, and two or more detectable features of the plurality of detectable features in the second ring target are identical.

4. The semiconductor device of claim 1, wherein at least one of one or more detectable features of the plurality of detectable features in the first ring target or one or more detectable features of the plurality of detectable features in the second ring target is circular features.

5. The semiconductor device of claim 1, wherein at least one of one or more detectable features of the plurality of detectable features in the first ring target or one or more detectable features of the plurality of detectable features in the second ring target is smaller than a resolution limit of the semiconductor device.

6. The semiconductor device of claim 2, wherein constructing at least one of the first mathematically constructed circle or the second mathematically constructed circle overlaid on a portion of an image of the semiconductor device including at least one of the first ring target or the second ring target further comprises adjusting a ratio $F_N/F_2$, wherein $F_N$ represents a spatial frequency associated with N detectable features associated with the at least one of the first ring target or the second ring target, and $F_2$ represents an overlap frequency.

7. A metrology system, comprising:
   an imager, the imager configured for obtaining an image of a semiconductor device; and
   a processor, the processor configured for:
      identifying a first ring target from the image of the semiconductor device, the first ring target including a plurality of detectable features arranged in a circular manner having a first circumference;
      detecting a center of the first ring target by:
         constructing a first mathematically constructed circle overlaid on a portion of the image of the semiconductor device including the first ring target, wherein a circumference of the first mathematically constructed circle is aligned along the plurality of detectable features associated with the first ring target, and
         determining the center of the first ring target as a center of the first mathematically constructed circle; and
      utilizing the detected center of the first ring target for overlay measurement.

8. The metrology system of claim 7, wherein the processor detects the center of the first ring target by shifting the first mathematically constructed circle to detect a maximal overlap with the first ring target.

9. The metrology system of claim 7, wherein two or more detectable features of the plurality of detectable features in the first ring target identified by the processor are spaced equally along the first circumference.

10. The metrology system of claim 7, wherein the processor is configured for:
    identifying a second ring target from the image of the semiconductor device, the second ring target including a plurality of detectable features arranged in a circular manner having a second circumference different from the first circumference;
    detecting a center of the second ring target by:
       constructing a second mathematically constructed circle overlaid on a portion of the image of the semiconductor device, wherein a circumference of the second mathematically constructed circle is aligned along the plurality of detectable features associated with the second ring target, and
       determining the center of the second ring target as a center of the second mathematically constructed circle; and
    measuring a displacement between the detected center of the first ring target and the detected center of the second ring target.

11. The metrology system of claim 9, wherein two or more detectable features of the plurality of detectable features in the first ring target are identical.

12. The metrology system of claim 10, wherein at least one of one or more detectable features of the plurality of detectable features in the first ring target or one or more detectable features of the plurality of detectable features in the second ring target is smaller than a resolution limit of the metrology system.

13. The metrology system of claim 10, wherein the processor detects the center of the second ring target by shifting the second mathematically constructed circle to detect a maximal overlap with the second ring target.

14. The metrology system of claim 10, wherein the first ring target is located on a first processing layer of the semiconductor device and the second ring target is located on a second processing layer of the semiconductor device.

15. The metrology system of claim 10, wherein two or more detectable features of the plurality of detectable features in the second ring target identified by the processor are spaced equally along the second circumference.

16. The metrology system of claim 14, wherein the displacement between the detected center of the first ring target and the detected center of the second ring target indicates an overlay error between the first processing layer and the second processing layer.

17. The metrology system of claim 15, wherein two or more detectable features of the plurality of detectable features in the second ring target are identical.

18. The metrology system of claim 15, wherein constructing at least one of the first mathematically constructed circle or the second mathematically constructed circle overlaid on a portion of an image of the semiconductor device including at least one of the first ring target or the second ring target further comprises adjusting a ratio $F_N/F_2$, wherein $F_N$ represents a spatial frequency associated with N detectable features associated with the at least one of the first ring target or the second ring target, and $F_2$ represents an overlap frequency.

19. An overlay measurement method comprising:
    obtaining an image of a semiconductor device;
    identifying a first ring target from the image of the semiconductor device, the first ring target including a plurality of detectable features arranged in a circular manner having a first circumference;
    detecting a center of the first ring target by:
        constructing a first mathematically constructed circle overlaid on a portion of the image of the semiconductor device including the first ring target, wherein a circumference of the first mathematically constructed circle is aligned along the plurality of detectable features associated with the first ring target, and
        determining the center of the first ring target as a center of the first mathematically constructed circle; and
    utilizing the detected center of the first ring target for overlay measurement.

20. The method of claim 19, wherein two or more detectable features of the plurality of detectable features are identical.

21. The method of claim 19, wherein said constructing a first mathematically constructed circle overlaid on a portion of the image of the semiconductor device including the first ring target includes shifting the first mathematically constructed circle to detect a maximal overlap with the first ring target.

22. The method of claim 19, further comprising:
    identifying a second ring target from the image of the semiconductor device, the second ring target including a plurality of detectable features arranged in a circular manner having a second circumference different from the first circumference; and
    detecting a center of the second ring target by:
        constructing a second mathematically constructed circle overlaid on a portion of the image of the semiconductor device including the second ring target, wherein a circumference of the second mathematically constructed circle is aligned along the plurality of detectable features associated with the second ring target, and
        determining the center of the second ring target as a center of the second mathematically constructed circle; and
    utilizing the detected center of the first ring target and the detected center of the second ring for the overlay measurement.

23. The method of claim 22, wherein said constructing a second mathematically constructed circle overlaid on a portion of the image of the semiconductor device including the second ring target includes shifting the second mathematically constructed circle to detect a maximal overlap with the second ring target.

24. The method of claim 22, wherein the overlay measurement is measured by a displacement between the detected center of the first ring target and the detected center of the second ring target.

25. The method of claim 22, wherein two or more detectable features of the plurality of detectable features in the first ring target are spaced equally along the first circumference, and two or more detectable features of the plurality of detectable features in the second ring target are spaced equally along the second circumference.

26. The method of claim 25, wherein constructing at least one of the first mathematically constructed circle or the second mathematically constructed circle overlaid on a portion of an image of the semiconductor device including at least one of the first ring target or the second ring target further comprises adjusting a ratio $F_N/F_2$, wherein $F_N$ represents a spatial frequency associated with N detectable features associated with the at least one of the first ring target or the second ring target, and $F_2$ represents an overlap frequency.

* * * * *